(12) United States Patent
Lee et al.

(10) Patent No.: US 10,693,438 B2
(45) Date of Patent: Jun. 23, 2020

(54) ACOUSTIC WAVE RESONATOR AND METHOD FOR MANUFACTURING THE SAME

(71) Applicant: Samsung Electro-Mechanics Co., Ltd., Suwon-si (KR)

(72) Inventors: Yeong Gyu Lee, Suwon-si (KR); Sung Won Im, Suwon-si (KR); Dong Woon Chang, Suwon-si (KR); Hyung Goo Baek, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 323 days.

(21) Appl. No.: 15/789,629

(22) Filed: Oct. 20, 2017

(65) Prior Publication Data
US 2018/0191328 A1    Jul. 5, 2018

(30) Foreign Application Priority Data

Jan. 5, 2017    (KR) ........................ 10-2017-0001964

(51) Int. Cl.
  *H03H 9/05*    (2006.01)
  *H03H 9/02*    (2006.01)
  (Continued)

(52) U.S. Cl.
  CPC .......... *H03H 9/0514* (2013.01); *H01L 24/03* (2013.01); *H01L 24/05* (2013.01); *H01L 41/0475* (2013.01); *H01L 41/29* (2013.01); *H03H 3/02* (2013.01); *H03H 3/04* (2013.01); *H03H 9/0211* (2013.01); *H03H 9/02133* (2013.01); *H03H 9/105* (2013.01); *H03H 9/1014* (2013.01); *H03H 9/173* (2013.01); *H03H 9/174* (2013.01); *H03H 9/547* (2013.01); *H01L 2224/02206* (2013.01); *H01L 2224/02215* (2013.01);
  (Continued)

(58) Field of Classification Search
  CPC ..... H01L 24/03; H01L 24/05; H01L 41/0475; H01L 41/29; H01L 2224/02215; H01L 2924/05442; H01L 2224/02206; H03H 2003/021; H03H 9/0514
  See application file for complete search history.

(56) References Cited

U.S. PATENT DOCUMENTS

2007/0058003 A1*  3/2007  Aoki ................... H03H 9/1071
                                                   347/68
2013/0147033 A1*  6/2013  Chen .................. H01L 23/3192
                                                   257/737
(Continued)

FOREIGN PATENT DOCUMENTS

JP        2009-200067 A     9/2009
JP        4722532 B2         7/2011

*Primary Examiner* — Bryan P Gordon
(74) *Attorney, Agent, or Firm* — NSIP Law

(57) ABSTRACT

An acoustic wave resonator includes: a substrate; a resonating portion formed on a first surface of the substrate; a metal pad connected to the resonating portion through a via hole formed in the substrate; and a protective layer disposed on a second surface of the substrate and including a plurality of layers, wherein the plurality of layers includes an internal protective layer directly in contact with the second surface of the substrate and formed of an insulating material including an adhesion that is stronger than an adhesion of other layers, among the plurality of layers.

9 Claims, 4 Drawing Sheets

(51) Int. Cl.
    *H03H 9/54*       (2006.01)
    *H03H 9/10*       (2006.01)
    *H03H 9/17*       (2006.01)
    *H03H 3/04*       (2006.01)
    *H01L 23/00*      (2006.01)
    *H01L 41/047*     (2006.01)
    *H01L 41/29*      (2013.01)
    *H03H 3/02*       (2006.01)

(52) U.S. Cl.
    CPC ............... *H01L 2224/03424* (2013.01); *H01L 2224/03464* (2013.01); *H01L 2224/05144* (2013.01); *H01L 2224/05147* (2013.01); *H01L 2224/05564* (2013.01); *H01L 2224/05582* (2013.01); *H01L 2224/05644* (2013.01); *H01L 2224/05655* (2013.01); *H01L 2924/05042* (2013.01); *H01L 2924/05432* (2013.01); *H01L 2924/05442* (2013.01); *H01L 2924/35121* (2013.01); *H03H 2003/021* (2013.01); *H03H 2003/023* (2013.01)

(56) References Cited

U.S. PATENT DOCUMENTS

| | | | |
|---|---|---|---|
| 2013/0147320 A1* | 6/2013 | Son | H03H 9/173 |
| | | | 310/340 |
| 2013/0187269 A1* | 7/2013 | Lin | H01L 24/81 |
| | | | 257/737 |
| 2016/0204761 A1* | 7/2016 | Lee | H03H 3/02 |
| | | | 333/187 |

\* cited by examiner

ACOUSTIC WAVE RESONATOR AND METHOD FOR MANUFACTURING THE SAME

CROSS-REFERENCE TO RELATED APPLICATIONS

This application claims the benefit under 35 U.S.C. § 119(a) of Korean Patent Application No. 10-2017-0001964 filed on Jan. 5, 2017 in the Korean Intellectual Property Office, the entire disclosure of which is incorporated herein by reference for all purposes.

BACKGROUND

1. Field

The following description relates to an acoustic wave resonator and a method for manufacturing the same.

2. Description of Related Art

A band pass filter is a key component of a communications device that selects only a signal of a necessary frequency band, from among various frequency bands, to transmit and receive the selected signal.

Representative examples of such a band pass filter include a surface acoustic wave (SAW) filter and a bulk acoustic wave (BAW) filter.

The BAW filter is a thin film type element that is implemented as a filter, and induces resonance using piezoelectric characteristics of a piezoelectric dielectric material deposited on a silicon wafer (a semiconductor substrate).

The BAW filter is used in mobile communications devices, small and lightweight filters such as chemical and biological devices, oscillators, resonance elements, and acoustic wave resonance mass sensors.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave resonator includes: a substrate; a resonating portion formed on a first surface of the substrate; a metal pad connected to the resonating portion through a via hole formed in the substrate; and a protective layer disposed on a second surface of the substrate and including a plurality of layers, wherein the plurality of layers includes an internal protective layer directly in contact with the second surface of the substrate and formed of an insulating material including an adhesion that is stronger than an adhesion of other layers, among the plurality of layers.

The internal protective layer may be formed of a material comprising any one or any combination of any two or more of silicon dioxide, aluminum oxide, and silicon nitride.

The plurality of layers may further include an external protective layer disposed on an outer surface of the internal protective layer and being externally exposed. The external protective layer may be formed of an insulating material including an elastic properties that is stronger than an elastic properties of the internal protective layer.

The external protective layer may be formed of a polymer material.

A portion of protective layer may be formed in the via hole to be continuous with a portion of the protective layer formed on the second surface of the substrate.

The metal pad may be disposed on the second surface of the substrate, adjacent to the via hole.

The metal pad may include an internal pad connected to the resonating portion and including an inner surface coupled to the second surface of the substrate, and an external pad including an inside surface coupled to an outer surface of the internal pad, and an externally exposed outside surface comprising an edge portion that is partially covered by the external protective layer.

In another general aspect, a method to manufacture an acoustic wave resonator includes: forming a resonating portion on a first surface of a substrate; forming a via hole penetrating through the substrate; forming an internal pad connected to the resonating portion on a second surface of the substrate; forming an internal protective layer on the second surface of the substrate; forming an external pad coupled to the internal pad; and forming an external protective layer on an outer surface of the internal protective layer, wherein the internal protective layer is formed of a first insulating material comprising an adhesion that is stronger than an adhesion of the external protective layer, and wherein the external protective layer is formed of a second insulating material comprising an elastic properties that is stronger than an elastic properties of the internal protective layer.

The internal protective layer may be further formed in the via hole to be continuous with the second surface of the substrate. The external protective layer may be further formed on an outer surface of a portion of the internal protective layer formed in the via hole.

The method may further include forming the external protective layer to partially cover an externally exposed surface of the external pad.

The first insulating material may include any one or any combination of any two or more of silicon dioxide, aluminum oxide, and silicon nitride.

The second insulating material may include a polymer material.

The forming of the internal protective layer on the second surface of the substrate may include forming the internal protective layer directly on the second surface of the substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
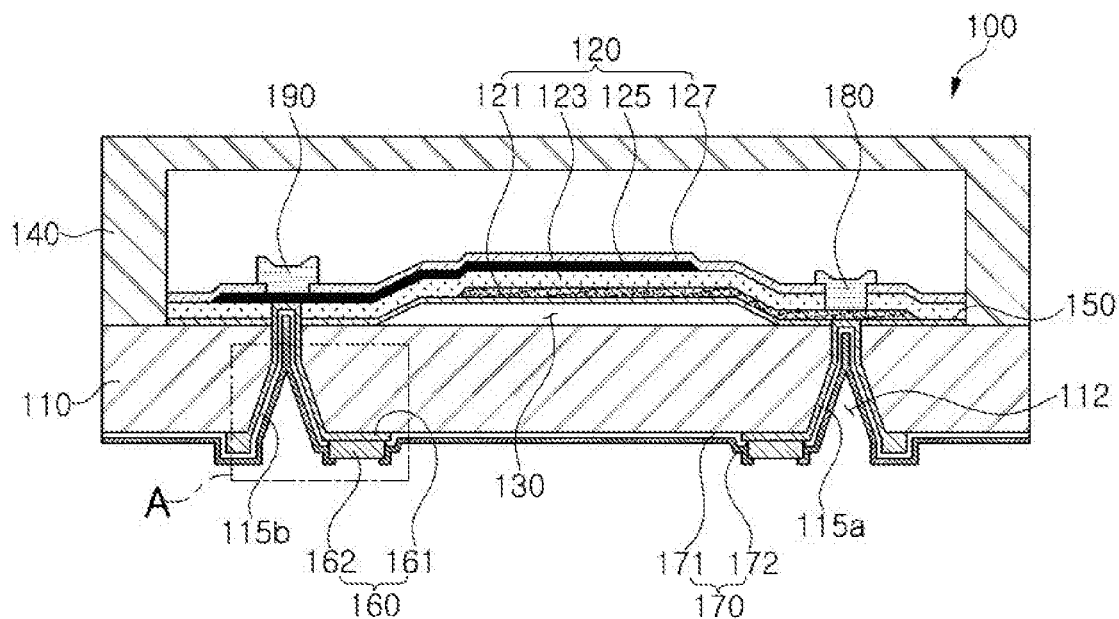
FIG. 1 is a cross-sectional view schematically illustrating an acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, embodiments be described in detail with reference to the accompanying drawings.

Referring to FIG. 1, an acoustic wave resonator 100, according to an example, is a bulk acoustic wave (BAW) filter among band pass filters, and may be connected to an external circuit through a metal pad 160.

The metal pad 160 may be electrically connected or short-circuited. In order to connect the metal pad 160 to the external circuit, the metal pad 160 may be electrically coupled to an external electrode of the external circuit through a solder. That is, the metal pad 160 may be connected to the external electrode through a solder reflow operation.

In addition, in order to prevent diffusion of the solder to be coupled and to prevent a short circuit between adjacent metal pads 160, a protective layer 170 is formed as an insulating layer (passivation layer). In this case, the protective layer 170 is formed on a surface of a substrate 110 on which the metal pad 160 is formed.

Conventionally, in a case in which a protective layer, which is directly in contact with a substrate and coupled to the substrate, is formed of a polymer, a problem of delamination has occurred due to weak adhesion of the protective layer. Accordingly, since the solder is infiltrated into a delaminated space during the reflow operation of the solder, a problem of short-circuit defect between the metal pads has occurred.

However, according to the disclosed embodiment, since the protective layer 170, which is in contact with the substrate 110 and coupled to the substrate 110, is formed of an insulating material having good adhesion, the aforementioned delamination and short-circuit problem may be prevented. For example, the protective layer 170 is formed of a plurality of layers, and an internal protective layer 171, which is an innermost layer among the plurality of layers, includes the insulating material having good adhesion. Therefore, the aforementioned problem of the conventional structure may be prevented.

As an example, the internal protective layer 171 is formed of a material including any one or any combination of any two or more of silicon dioxide ($SiO_2$), aluminum oxide ($Al_2O_3$), and silicon nitride ($SiN_x$).

Conventionally, in order to prevent the delamination defect caused by forming the protective layer of the polymer, the protective layer has been formed by depositing an inorganic film. That is, since an adhered state of the inorganic film may be formed to have stronger adhesion by a method for depositing the inorganic film by acceleration energy in a vacuum state than a method for depositing the inorganic film by coating a polymer, the inorganic film has been applied to prevent the problem of delamination described above.

However, in a case in which the protective layer is formed using the organic film as in the related art, there is a problem that the protective layer does not withstand strong pressure and is damaged by the large Young's modulus of the inorganic film.

However, according to the disclosed embodiment, since a layer of the protective layer 170 that is externally exposed (e.g., exposed to the outside environment) is formed of an insulating material having good elastic properties, such a problem may be prevented. For example, the protective layer 170 includes an external protective layer 172, which is an outermost layer among the plurality of layers and is formed on an outer surface of the internal protective layer 170. The external protective layer 172 is exposed to the outside, and is formed of an insulating material having a relatively greater, or stronger, elastic properties than an elastic properties of the internal protective layer 171. Thus, the conventional problem of the protective layer not withstanding strong pressure and being damaged may be prevented. As an example, the external protective layer 172 is formed of a polymer material such as polyimide.

Accordingly, as described above, the acoustic wave resonator 100 includes, as an insulating protective layer of an electrical circuit, the protective layer 170 that includes the plurality of layers to: 1) prevent the problem of the short-circuit in the solder reflow operation due to the delamination occurring in a polymer single protective layer; and 2) solve the problem of damage by pressure acting on an organic thin film single protective layer in a molding operation, due to large Young's modulus characteristics of the organic thin film single protective layer.

That is, this disclosure relates to a structure of the acoustic wave resonator 100 having a double protective layer 170 including the organic thin film layer and the polymer layer, and: 1) preventing the problem of the short-circuit by excellent adhesion by forming the internal protective layer 171 of the organic thin film layer in an inner portion of the resonator 100, directly in contact with the substrate 110; and 2) preventing the problem of damage by external pressure by forming the external protective layer 172 of the polymer layer having a small Young's modulus and good elastic properties at an outer portion of the resonator 100 on which the external pressure acts.

Figure 2:
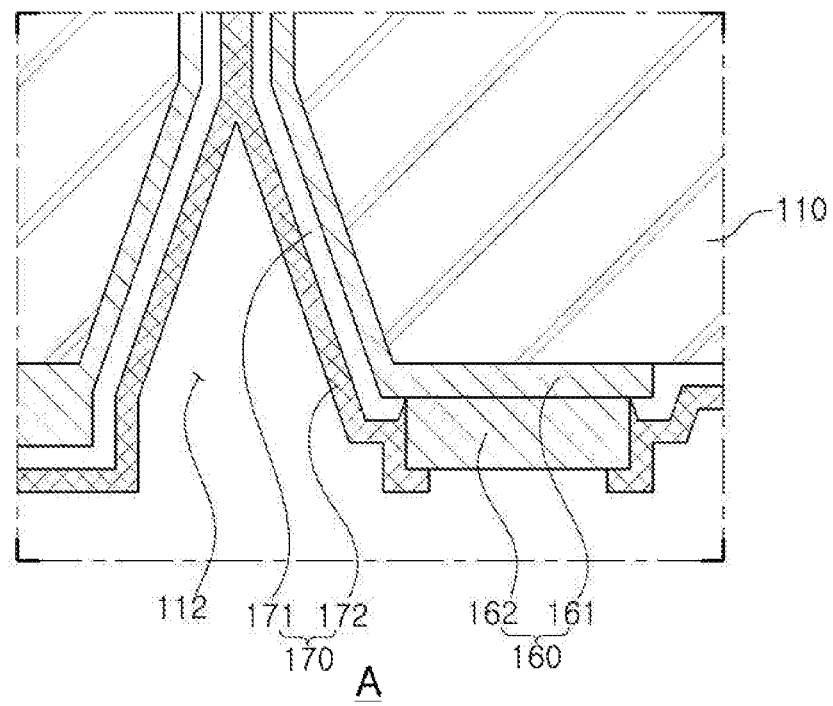
FIG. 2 is an enlarged cross-sectional view of a part A of FIG. 1.

FIG. 1 is a cross-sectional view schematically illustrating the acoustic wave resonator 100, according to an embodiment. FIG. 2 is an enlarged cross-sectional view of a part A of FIG. 1.

As illustrated in FIG. 1, the acoustic wave resonator 100 includes the substrate 110, a resonating portion 120, the metal pad 160, and the protective layer 170.

An air gap 130 is formed between the substrate 110 and the resonating portion 120, and the resonating portion 120 is formed on a membrane layer 150 so as to be spaced apart from the substrate 110 by the air gap 130.

The substrate 110 may be a silicon substrate or a substrate of a high resistivity silicon (HRS) type. However, the substrate 110 is not limited to the foregoing examples.

The resonating portion 120 includes a first electrode 121, a piezoelectric layer 123, and a second electrode 125. The resonating portion 120 is formed by stacking the first electrode 121, the piezoelectric layer 123, and the second electrode 125 from below. Thus, the piezoelectric layer 123 is disposed between the first electrode 121 and the second electrode 125.

Since the resonating portion 120 is formed on the membrane layer 150, the membrane layer 150, the first electrode 121, the piezoelectric layer 123, and the second electrode 125 are sequentially stacked and disposed on a first surface of the substrate 110.

The resonating portion 120 allows the piezoelectric layer 123 to resonate in response to signals applied to the first electrode 121 and the second electrode 125 to generate a resonance frequency and an antiresonance frequency.

The first electrode 121 and the second electrode 125 may be formed of a metal such as gold, molybdenum, ruthenium, aluminum, platinum, titanium, tungsten, palladium, chromium, or nickel.

The resonating portion 120 uses an acoustic wave of the piezoelectric layer 123. For example, when the signals are applied to the first electrode 121 and the second electrode 125, mechanical vibration occurs in a thickness direction of the piezoelectric layer 123 to generate the acoustic wave.

The piezoelectric layer 123 may include any one or any combination of any two or more of zinc oxide (ZnO), aluminum nitride (AlN), and quartz.

A resonance phenomenon of the piezoelectric layer 123 occurs when a half of a wavelength of the applied signal coincides with a thickness of the piezoelectric layer 123. Since electrical impedance is sharply changed when the resonance phenomenon occurs, the acoustic wave resonator 100 may be used as a filter capable of selecting a frequency.

The resonance frequency is determined by the thickness of the piezoelectric layer 123, the first electrode 121 and the second electrode 125 that surround the piezoelectric layer 123, and inherent elastic wave velocity of the piezoelectric layer 123. As an example, the resonance frequency increases as the thickness of the piezoelectric layer 123 becomes thinner.

The resonating portion 120 further includes a top surface cover layer 127. The top surface cover layer 127 is formed on the second electrode 125 to prevent the second electrode 125 from being exposed to an external environment.

The first electrode 121 and the second electrode 125 are extended to an outside of the piezoelectric layer 123, and are connected to a first connection electrode 180 and a second connection electrode 190, respectively.

The first connection electrode 180 and the second connection electrode 190 are provided to confirm characteristics of the resonator and the filter and to perform a required frequency trimming. However, first connection electrode 180 and the second connection electrode 190 are not limited to such a purpose.

The resonating portion 120 is spaced apart from the substrate 110 by the air gap 130 in order to improve a quality factor.

For example, the acoustic wave generated from the piezoelectric layer 123 is not affected by the substrate 110 by forming the air gap 130 between the resonating portion 120 and the substrate 110.

Further, reflective characteristics of the acoustic wave generated from the resonating portion 120 are improved by the air gap 130. Since the air gap 130, which is an empty space, has impedance that closes to infinity, the acoustic wave is not lost by the air gap 130 and remains in the resonating portion 120.

Therefore, a quality factor value of the resonating portion 120 is improved by reducing loss in the acoustic wave in a longitudinal direction by the air gap 130.

Via holes 112 penetrating through the substrate 110 are formed in the substrate 110. In addition, first and second connection conductors 115a and 115b are each formed in one of the via holes 112.

First and second connection conductors 115a and 115b may be formed on an inner surface, that is, an entirety of an inner wall of the respective via hole 112, but are not limited to such a configuration.

Further, one end of the first and second connection conductors 115a and 115b is connected to the metal pad 160 formed on a lower surface of the substrate 110, and another end of the first and second connection conductors 115a and 115b is connected to the first electrode 121 or the second electrode 125.

For example, the first connection conductor 115a electrically connects the first electrode 121 and a metal pad 160 to each other, and a second connection conductor 115b electrically connects the second electrode 125 and another metal pad 160 to each other.

Therefore, the first connection conductor 115a penetrates through the substrate 110 and the membrane layer 150 and is electrically connected to the first electrode 121, and the second connection conductor 115b penetrates through the substrate 110, the membrane layer 150, and the piezoelectric layer 123 and is electrically connected to the second electrode 125.

Although the disclosed embodiment illustrates and describes only two via holes 112 and two connection conductors 115a and 115b, the number of via holes and connection conductors is not limited to the number illustrated and described. A larger number of via holes 112 and connection conductors 115a and 115b may be provided, as needed.

A cap 140 is provided to protect the resonating portion 120 from the external environment. The cap 140 is formed in a cover form including an internal space in which the resonating portion 120 is accommodated. Thus, the cap 140 may be bonded to the substrate 110 in a form in which a side wall of the cap 140 surrounds the resonating portion 120. In addition, a lower surface of the side wall may be used as a bonding surface with the substrate 110.

The metal pad 160, which is a component that electrically connects the external electrode and the acoustic wave resonator 100 to each other, is formed on a second surface of the substrate 110 that is opposite to the first surface of the substrate 110 on which the resonating portion 120 is formed.

In particular, the metal pad 160 is connected to the resonating portion 120 through the connection conductors 115a and 115b formed through the via holes 112.

Therefore, the protective layer 170, which is formed to prevent a short-circuit between adjacent metal pads 160, is also formed in the via holes 112. In addition, a portion of the protective layer 170 formed in the via holes 112, and a portion of the protective layer 170 formed on the second surface of the substrate 110, which is a lower surface of the substrate 110, are continuously formed to prevent the short-circuit between metal pads 160.

In addition, the metal pad 160 includes a plurality of pads so that the protective layer 170 is formed in the plurality of layers. That is, the metal pad 160 includes an internal pad 161 and an external pad 162.

The internal pad 161 is connected to the resonating portion 120 through the connection conductors 115a and 115b, and an inner surface of the internal pad 161 is coupled to the second surface of the substrate 110.

As shown in FIGS. 1 and 2, an inside surface of the external pad 162 is coupled to an outer surface of the internal pad 161, and an outside surface of the external pad 162 is exposed to the external environment. For example, an edge portion of the outside surface of the external pad 162 is partially wrapped, or covered, by the external protective layer 172, and the external pad 162 may therefore prevent a separation of the solder connected to the external electrode, and may increase coupling stability between the external pad 162 and the internal pad 162.

The protective layer 170 is formed to prevent the short-circuit between the adjacent metal pads 160. In particular, the protective layer 170 includes the internal protective layer 171 to increase a coupling force with the substrate 110, and includes the external protective layer 172 to prevent damage caused by external pressure.

As described above, the internal protective layer 171 is directly in contact with the second surface of the substrate 110, and is formed of the insulating material having better, or stronger, adhesion than an adhesion of other layers of the protective layer 170.

As described above, the external protective layer 172 is formed on the outer surface of the internal protective layer 171 and is exposed to the external environment, and is formed of the insulating material having a stronger elastic properties than an elastic properties of the internal protective layer 171.

Here, since the protective layer 170 including the plurality of layers, including the internal protective layer 171 and the external protective layer 172, is also formed in the via hole 112, a problem of delamination of the protective layer 170 and a problem of damage caused by external pressure in the via hole may be prevented.

In particular, in the conventional protective layer, the problem of delamination and the problem of damage have more easily occurred at a portion in which a shape deformation of the protective layer is sharp, such as in the vicinity of the via hole 112. However, conventionally, a solution for this problem was not suggested due to the lack of awareness of the problem. However, in order to actively solve the problems of delamination and damage in the via hole 112 and in the vicinity of the via hole 112, the protective layer 170 is also be provided in the via hole 112.

FIGS. 3 through 7 are views illustrating a method for manufacturing the acoustic wave resonator 100, according to an embodiment. Referring to FIGS. 3 through 7, the method includes an operation of forming the resonating portion 120 on the first surface of a substrate 110, an operation of forming the via hole 112 penetrating through the substrate 110 and forming the internal pad 161 connected to the resonating portion 120 on the second surface of the substrate 110, an operation of forming the internal protective layer 171 on the second surface of the substrate 110, an operation of forming the external pad 162 coupled to the internal pad 161, and an operation of forming the external protective layer 172 on the outer surface of the internal protective layer 171, wherein the internal protective layer 171 is formed of the insulating material having stronger adhesion than the external protective layer 172, and the external protective layer 172 may be formed of the insulating material having stronger elastic properties than the internal protective layer 171.

Figure 3:
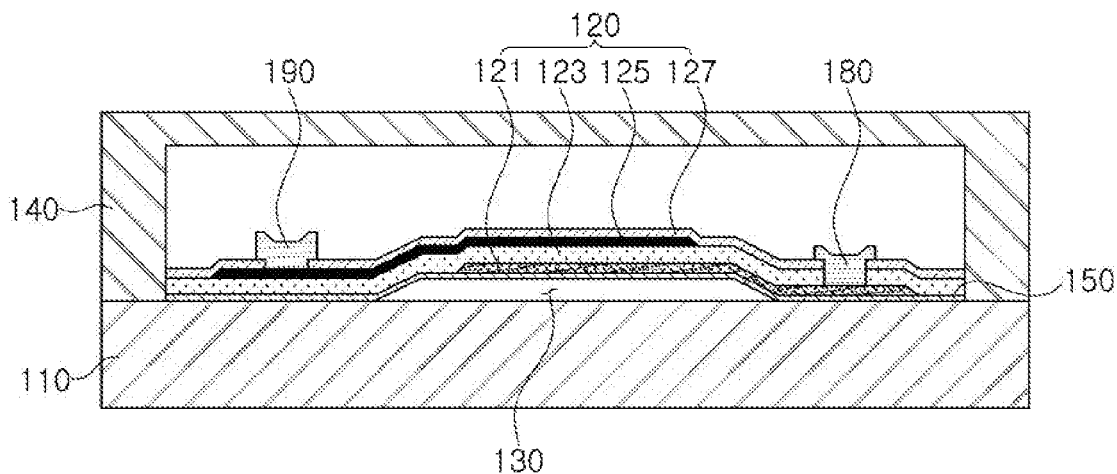
FIGS. 3 through 7 are cross-sectional views illustrating a method for manufacturing an acoustic wave resonator, according to an embodiment.

First, referring to FIG. 3, the resonating portion 120 is formed on the substrate 110. The resonating portion 120 is formed, for example, by sequentially laminating the membrane layer 150, the first electrode 121, the piezoelectric layer 123, the second electrode 125, and the top surface cover layer 127 on the substrate 110. Further, after a sacrificial layer (not illustrated) is formed before forming the membrane layer 150, the air gap 130 is formed by removing the sacrificial layer later.

The first electrode 121 and the second electrode 125 are formed in desired patterns by forming a conductive layer, depositing a photoresist on the conductive layer, performing a patterning for the photoresist using a photolithography process, and then using the patterned photoresist as a mask to remove unnecessary portions of the conductive layer.

As an example, the first electrode 121 is formed of a molybdenum (Mo) material, and the second electrode 125 is formed of ruthenium (Ru). However, the materials of the first and second electrodes 121 and 125 are not limited to the provided examples, and the first electrode 121 and the second electrode 125 may be formed of various metals such as gold, ruthenium, aluminum, platinum, titanium, tungsten, palladium, chromium, and nickel, as needed.

Further, the piezoelectric layer 123 may be formed of aluminum nitride (AlN). However, the material of the piezoelectric layer 123 is not limited to AlN, and the piezoelectric layer 123 may be formed of various piezoelectric materials such as zinc oxide (ZnO) and quartz.

The top surface cover layer 127 is formed of an insulating material. The insulating material of the top surface cover layer 127 may include any one or any combination of any two or more of a silicon oxide based material, a silicon nitride based material, and an aluminum nitride based material.

Next, the connection electrodes 180 and 190 for a frequency trimming are formed on the first electrode 121 and the second electrode 125, respectively. The connection electrodes 180 and 190 penetrate through the top surface cover layer 127 or the piezoelectric layer 123 to be bonded to the first electrode 121 and the second electrode 125.

The first connection electrode 180 is formed by partially removing the top surface cover layer 127 and the piezoelectric layer 123 by an etching to externally expose the first electrode 121, and then depositing gold (Au) or copper (Cu), for example, on the first electrode 121.

Similarly, the second connection electrode 190 is formed by partially removing the top surface cover 127 by the etching to externally expose the second electrode 125, and then depositing gold (Au) or copper (Cu), for example, on the second electrode 125.

Next, after confirming characteristics of the resonating portion 120 and a filter, and performing a necessary frequency trimming using the connection electrodes 180 and 190, the air gap 130 is formed by removing the sacrificial layer.

Next, the cap 140 is formed to protect the resonating portion 120 from the external environment. The cap 140 is formed by a wafer bonding at a wafer level. That is, a substrate wafer on which a plurality of the substrates (e.g., unit substrates) 110 is disposed, and a cap wafer on which a plurality of the caps 140 is disposed are bonded to each other to be integrally formed.

The substrate 110 wafer and the cap 140 wafer which are bonded to each other are diced later by a dicing process and are divided into separate acoustic wave resonators 100.

Figure 4:
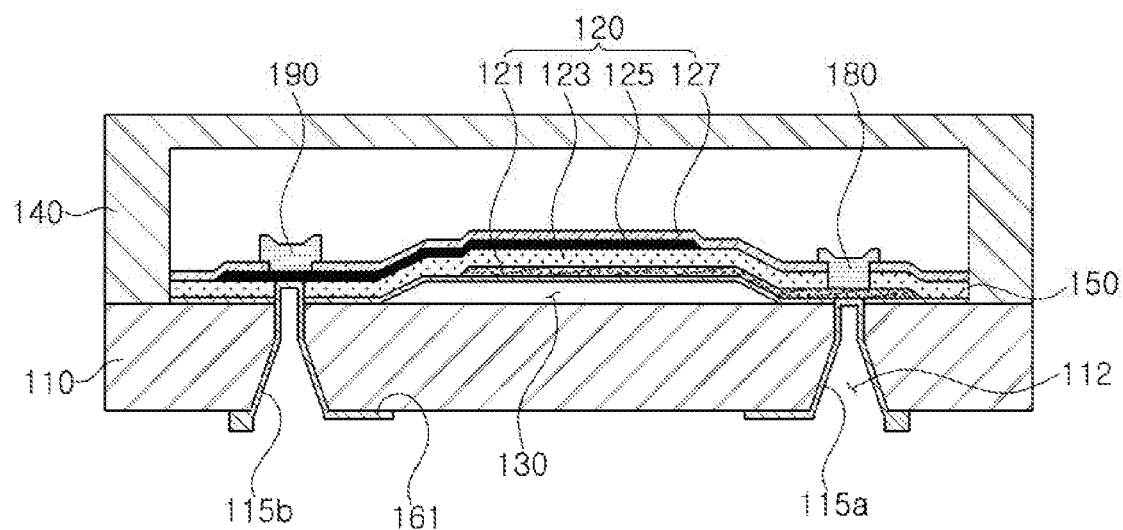

Next, referring to FIG. 4, the via hole 112 is formed in the substrate 110, on which the resonating portion 120 is formed, and the internal pad 161 is formed on a lower surface of the substrate 110 such that the internal pad 161 is connected to the resonating portion 120 through the connection conductors 115a and 115b.

The connection conductors are manufactured by forming a conductive layer on an inner surface of the via hole 112. As an example, the connection conductors are formed by depositing, coating, or filling a conductive metal (e.g., gold or copper) along the inner wall of the via hole 112. The internal pad 161 may be formed of the same material as that of the connection conductors, and is continuous with the connection conductors 115a and 115b.

Figure 5:
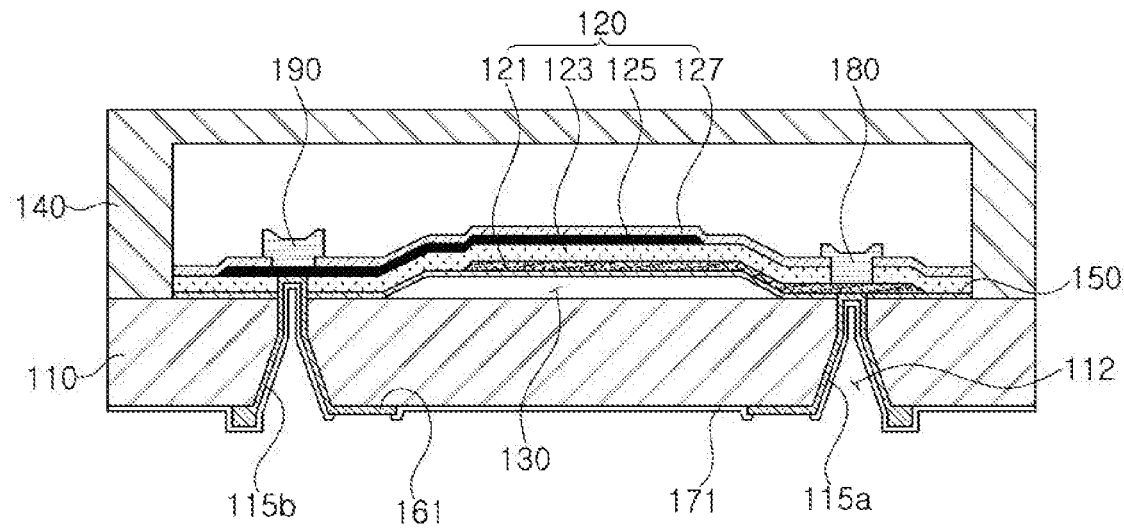

FIG. 5 illustrates an operation of forming the internal protective layer 171. The internal protective layer 171 is formed to provide an electrical insulating function for preventing a short-circuit between the internal pads 161 after forming the internal pads 161. In addition, the internal protective layer 171 is formed of an insulating material having a greater adhesion than an adhesion of other layers of the protective layer 170 in order to prevent the problem of delamination.

As an example, the internal protective layer 171 is formed of an inorganic thin film. The inorganic thin film may be formed of any one or any combination of any two or more of, silicon dioxide ($SiO_2$), silicon nitride ($SiN_x$), aluminum oxide ($Al_2O_3$), and a combination thereof. In addition, the inorganic thin film may be deposited by equipment such as PECVD, Sputter, and ALD.

After depositing the organic thin film on the entire second surface of the substrate 110, only a portion of the organic thin film disposed on a portion of the internal pad 161 that is to be connected to an external circuit is opened by a photolithography operation.

Figure 6:
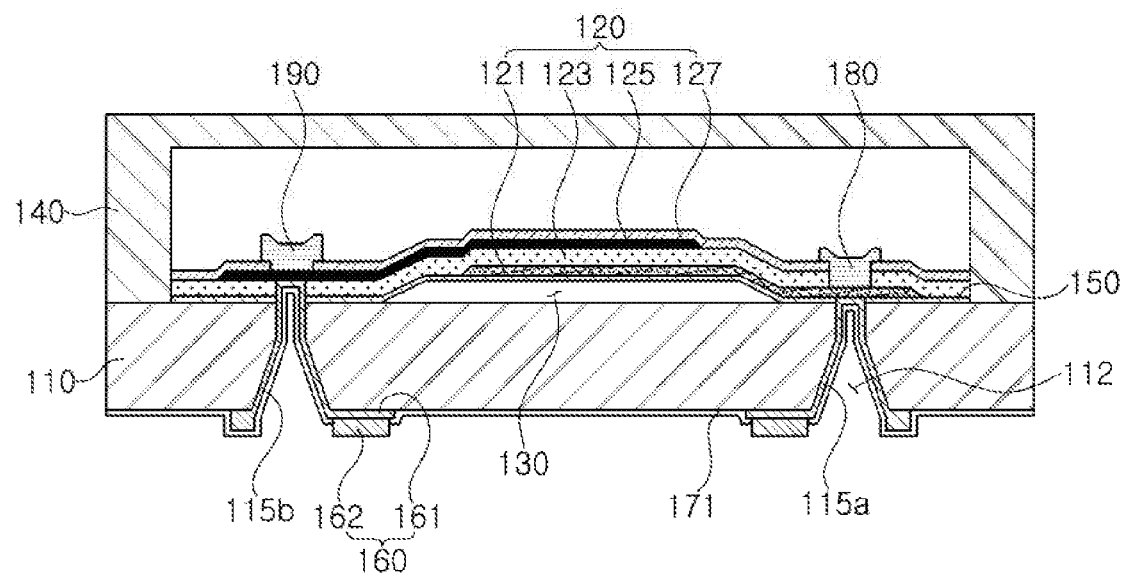

FIG. 6 illustrates an operation of forming the external pad 162. The external pad 162 is directly coupled to the external electrode of the external circuit by the solder.

The external pad 162 is manufactured by an electroless nickel immersion gold (ENIG) operation. In addition, the metal pad 160 including the external pad 162 and the internal pad 161 may have a thickness of about 4.0 to 6.0 μm.

Figure 7:
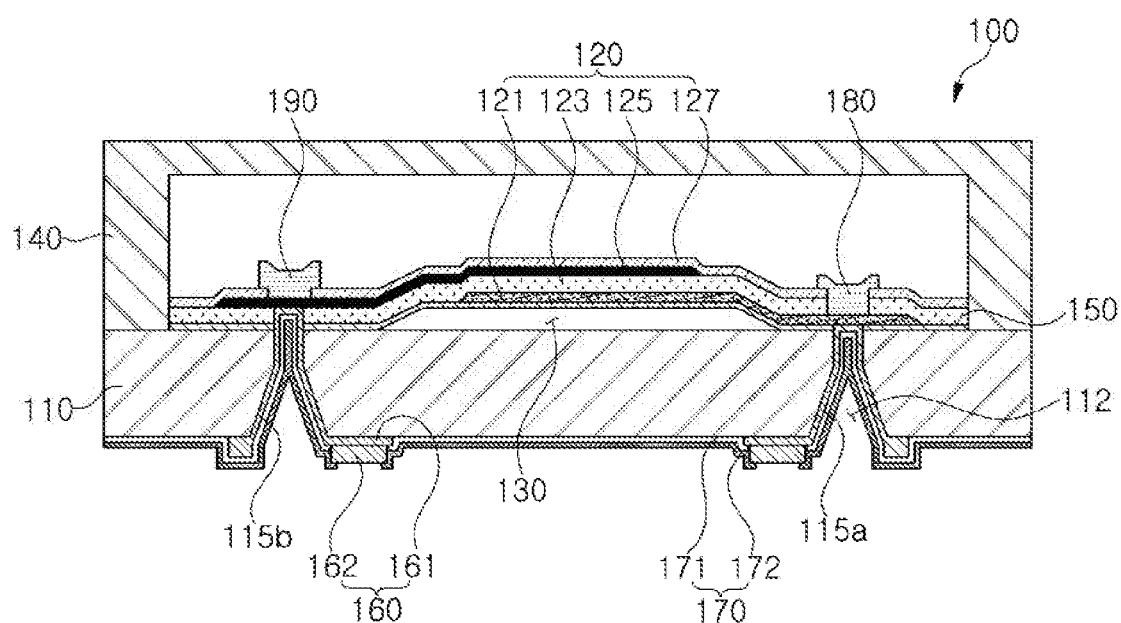

FIG. 7 illustrates an operation of forming the external protective layer 172. The external protective layer 172 is formed of an insulating material having a stronger elastic properties than an elastic properties of the internal protective layer 171. The external protective layer 172 may be formed of an insulating material having smaller Young's modulus than that of the internal protective layer 171.

As an example, the external protective layer 172 is formed of a polymer insulating layer, and is generally formed to wrap, or cover, all portions on the second side of the substrate 110 except for the external pad 162, through operations such as coating, exposure, pattern opening, and curing, using photo-reactive polyimide.

Here, since the external protective layer 172 wraps an edge portion of the external pad 162, in a case in which a solder is provided to couple the external pad 162 to the external electrode, the external protective layer 172 is positioned to prevent a separation of the solder.

As set forth above, according to the embodiments disclosed herein, the acoustic wave resonator may prevent the problem of delamination of the protective layer coupled to the substrate for insulation, thereby reducing the occurrence of a defect due to a short circuit.

In addition, the acoustic wave resonator may prevent the protective layer from being damaged by the pressure applied to the protective layer. In particular, the problem of delamination of the protective layer around a via hole and the problem of damage of the protective layer due to the pressure may be alleviated.

Various advantages and effects of this disclosure are not limited to the description above, and may be more readily understood in the description of embodiments in the present disclosure.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave resonator, comprising:
a substrate;
a resonating portion formed on a first surface of the substrate;
a metal pad connected to the resonating portion through a via hole formed in the substrate; and
a protective layer disposed on a second surface of the substrate and comprising a plurality of layers,
wherein the metal pad comprises an internal pad connected to the resonating portion, and comprising an inner surface disposed on the second surface of the substrate, and
wherein the plurality of layers comprises:
an internal protective layer directly in contact with the second surface of the substrate and an outer surface of the internal pad, and formed of a first insulating material; and
an external protective layer disposed on an outer surface of the internal protective layer.

2. The acoustic wave resonator of claim 1, wherein the internal protective layer is formed of a material comprising any one or any combination of any two or more of silicon dioxide, aluminum oxide, and silicon nitride.

3. The acoustic wave resonator of claim 1, wherein the external protective layer is formed of a second insulating material comprising elastic properties that are stronger than elastic properties of the internal protective layer.

4. The acoustic wave resonator of claim 3, wherein the external protective layer is formed of a polymer material.

5. The acoustic wave resonator of claim 3, wherein a portion of protective layer is formed in the via hole to be continuous with a portion of the protective layer formed on the second surface of the substrate.

6. The acoustic wave resonator of claim 5, wherein the metal pad is disposed on the second surface of the substrate, adjacent to the via hole.

7. The acoustic wave resonator of claim 6, wherein the metal pad further comprises an external pad comprising:
an inside surface coupled to an outer surface of the internal pad; and
an externally exposed outside surface comprising an edge portion that is partially covered by the external protective layer.

8. The acoustic wave resonator of claim 1, wherein the first insulating material comprises an adhesion that is greater than an adhesion of other layers, among the plurality of layers.

9. An acoustic wave resonator, comprising:
a substrate;
a resonating portion disposed on a first surface of the substrate;
a metal pad disposed on a second surface of the substrate;
a via hole formed in the substrate;
a connection conductor disposed on an inner wall of the via hole and connecting the metal pad to the resonating portion;
an internal protective layer disposed on the second surface of the substrate, and on an outer surface of the connection conductor in the via hole; and
an external protective layer disposed on an outer surface of portions of the internal protective layer disposed on the second surface of the substrate and in the via hole.

* * * * *